United States Patent
Ganusov et al.

(10) Patent No.: US 9,875,330 B2
(45) Date of Patent: Jan. 23, 2018

(54) FOLDING DUPLICATE INSTANCES OF MODULES IN A CIRCUIT DESIGN

(71) Applicant: Xilinx, Inc., San Jose, CA (US)

(72) Inventors: Ilya K. Ganusov, San Jose, CA (US); Henri Fraisse, Sunnyvale, CA (US); Ashish Sirasao, San Jose, CA (US); Alireza S. Kaviani, San Jose, CA (US)

(73) Assignee: XILINX, INC., San Jose, CA (US)

( * ) Notice: Subject to any disclaimer, the term of this patent is extended or adjusted under 35 U.S.C. 154(b) by 122 days.

(21) Appl. No.: 14/960,176

(22) Filed: Dec. 4, 2015

(65) Prior Publication Data

US 2017/0161419 A1   Jun. 8, 2017

(51) Int. Cl.
G06F 17/50   (2006.01)

(52) U.S. Cl.
CPC .................. G06F 17/5072 (2013.01)

(58) Field of Classification Search
USPC ........................................................ 716/119
See application file for complete search history.

(56) References Cited

U.S. PATENT DOCUMENTS

| | | | |
|---|---|---|---|
| 6,438,730 B1 * | 8/2002 | Atmakuri | G06F 17/5045 716/103 |
| 8,141,024 B2 | 3/2012 | Markov et al. | |
| 8,453,084 B2 | 5/2013 | Markov et al. | |
| 2003/0192017 A1 | 10/2003 | Baumgartner et al. | |
| 2007/0174794 A1 | 7/2007 | Oktem et al. | |
| 2012/0044957 A1 | 2/2012 | Saunders et al. | |

OTHER PUBLICATIONS

Canis, Andrew et al., "Multi-Pumping for Resource Reduction in FPGA High-Level Synthesis," Proc. of the 2013 Design, Automation & Test in Europe Conference & Exhibition, Mar. 18, 2013, pp. 194-197, IEEE, Piscataway, New Jersey, USA.

Weaver, Nicholas et al., "Post-Placement C-slow Retiming for the Xilinx Virtex FPGA," Powerpoint presentation at the 2003 ACM/SIGDA 11th International Symposium on Field Programmable Gate Arrays, Feb. 23, 2003, pp. 1-24.

Weaver, Nicholas et al., "Post-Placement C-slow Retiming for the Xilinx Virtex FPGA," Proceedings of the 2003 ACM/SIGDA 11th International Symposium on Field Programmable Gate Arrays, Feb. 23, 2003, pp. 185-194, ACM, New York, New York, USA.

Han, Inhak et al., "Folded Circuit Synthesis: Logic Simplification Using Dual Edge-Triggered Flip-Flops," Proc. of the 2013 International Conference on IC Design & Technology, May 29, 2013, pp. 17-20, IEEE, Piscataway, New Jersey, USA.

* cited by examiner

*Primary Examiner* — Bryce Aisaka
(74) *Attorney, Agent, or Firm* — LeRoy D. Maunu

(57) ABSTRACT

Disclosed approaches for processing a circuit design include identifying duplicate instances of a module in a representation of the circuit design. A processor circuit performs folding operations for at least one pair of the duplicate instances of the module. One instance of the duplicates is removed from the circuit design, and a multiplexer is inserted. The multiplexer receives and selects one of the input signals to the duplicate instances and provides the selected input signal to the remaining instance. For each flip-flop in the remaining instance, a pipelined flip-flop is inserted. Connections to a first clock signal in the remaining instance are replaced with connections to a second clock signal having twice the frequency of the first clock signal. An alignment circuit is inserted to receive the output signal from the first instance and provide concurrent first and second output signals.

20 Claims, 5 Drawing Sheets

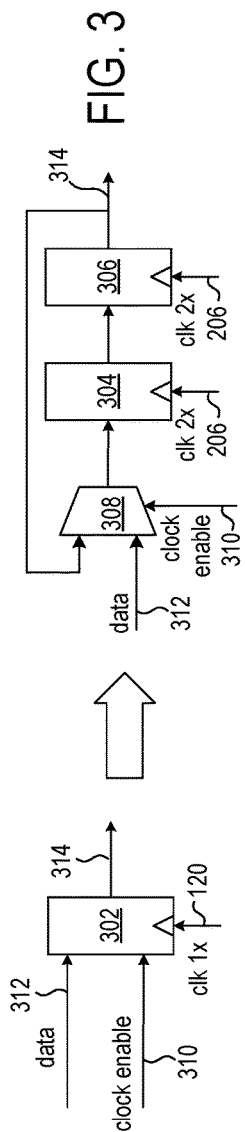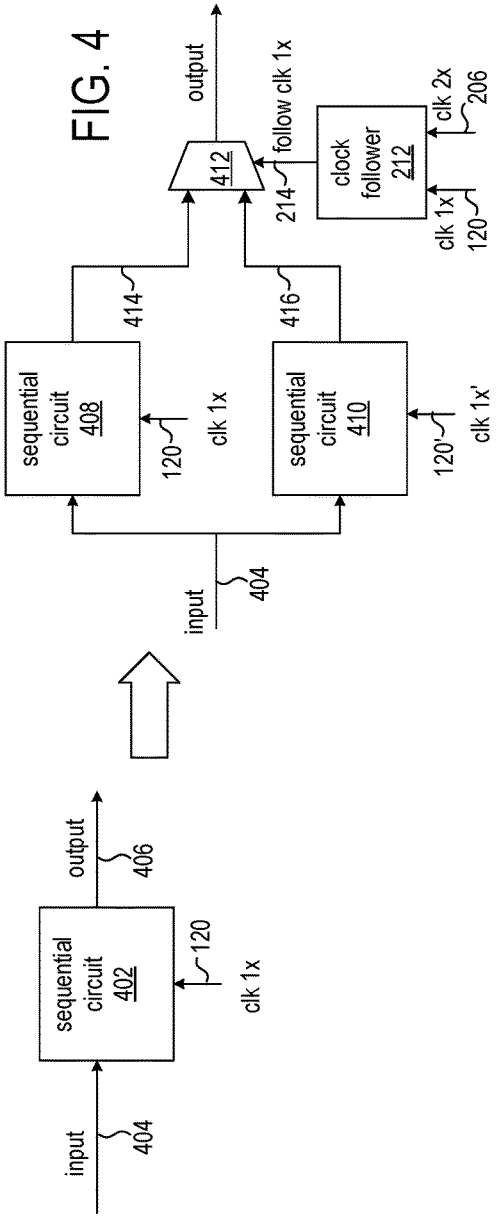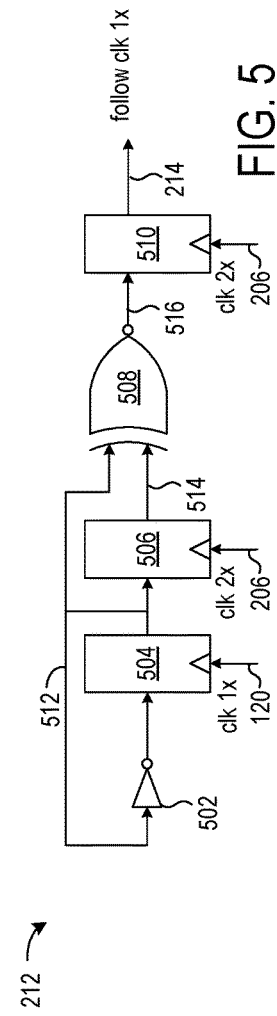

FOLDING DUPLICATE INSTANCES OF MODULES IN A CIRCUIT DESIGN

TECHNICAL FIELD

The disclosure generally relates to folding multiple instances of a module in a circuit design into a shared circuit.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

In many circuit designs targeting programmable ICs, multiple instances of a module may be instantiated in order to support parallel operations and improve performance of the implemented design. A greater number of duplicate instances, however, requires more space on the target device than might be required for non-parallel implementations. Thus, while duplicate instances of modules may improve performance, end product costs may increase due to a larger target device and increased power consumption.

SUMMARY

In one embodiment, a method of processing a circuit design includes identifying duplicate instances of a module in a representation of the circuit design. A processor circuit performs folding operations for at least one pair of the duplicate instances of the module. The pair of duplicate instances includes a first instance configured to receive a first input signal and generate a first output signal and a second instance configured to receive a second input signal and generate a second output signal. The folding operations include removing the second instance from the representation of the circuit design. The folding operations further include inserting circuit specifications in the remaining instance to support time division multiplexing of the logic. The inserted circuit specifications include a multiplexer that is configured to receive and select one of the first and second input signals and provide the selected one of the first and second signals to the remaining instance. The inserted circuit specifications further include, for each flip-flop in the first instance, a respective pipelined flip-flop coupled to the flip-flop. Connections to a first clock signal in the first instance are replaced with connections to a second clock signal. The frequency of the second clock signal is twice the frequency of the first clock signal. The inserted circuit specifications further include an alignment circuit that is configured to receive the first output signal from the first instance and provide the second output signal concurrent with the first output signal.

In another embodiment, a system is provided for processing a circuit design. The system includes a processor circuit and a memory. The memory is configured with instructions that when executed by the processor circuit cause the processor circuit to identify duplicate instances of a module in a representation of the circuit design. The processor circuit performs folding operations for at least one pair of the duplicate instances of the module. The pair of duplicate instances includes a first instance configured to receive a first input signal and generate a first output signal and a second instance configured to receive a second input signal and generate a second output signal. The folding operations include removing the second instance from the representation of the circuit design. The folding operations further include inserting circuit specifications in the remaining instance to support time division multiplexing of the logic. The inserted circuit specifications include a multiplexer that is configured to receive and select one of the first and second input signals and provide the selected one of the first and second signals to the remaining instance. The inserted circuit specifications further include, for each flip-flop in the first instance, a respective pipelined flip-flop coupled to the flip-flop. Connections to a first clock signal in the first instance are replaced with connections to a second clock signal. The frequency of the second clock signal is twice the frequency of the first clock signal. The inserted circuit specifications further include an alignment circuit that is configured to receive the first output signal from the first instance and provide the second output signal concurrent with the first output signal.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings in which:

FIG. 3 shows the transformation of a clock-enabled flip-flop found in two instances of a module when the instances are folded into a shared circuit;

FIG. 4 shows the transformation of a sequential circuit into parallel sequential circuits when two instances of a module are folded into a shared circuit;

FIG. 5 shows an example of a clock follower circuit;

DETAILED DESCRIPTION

Figure 1:
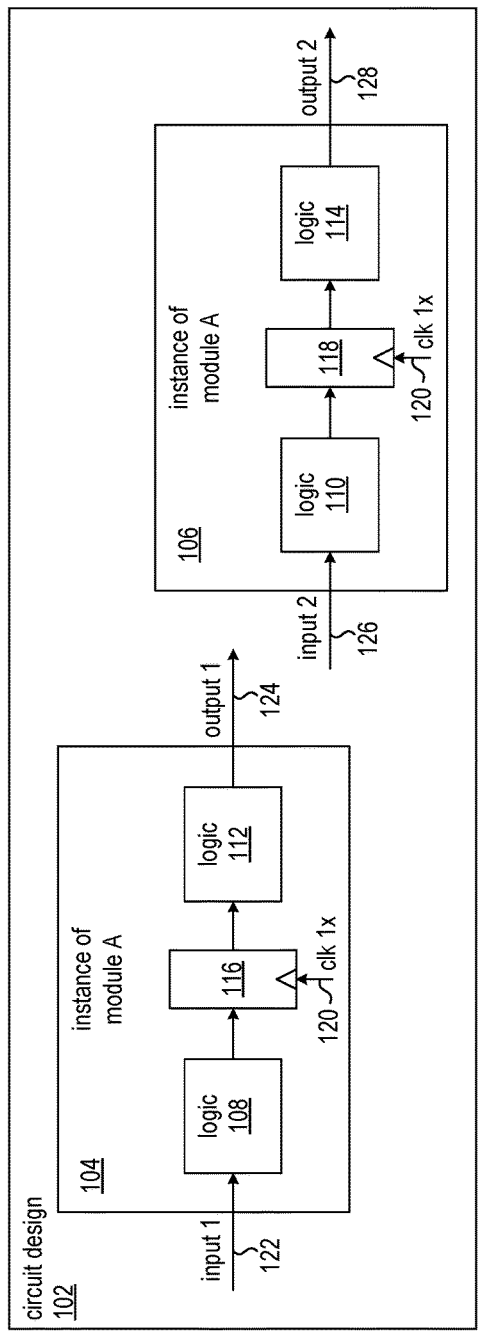
FIG. 1 shows a circuit design having duplicate instances of a module in a circuit design.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed methods and systems provide approaches for modifying a circuit design in a manner that reduces the die space that would be occupied by an implementation of the circuit design having parallel instances of a module while maintaining the level of performance offered by the implementation having the parallel instances. According to the disclosed approaches, a processor circuit identifies duplicate instances of modules in a circuit design as represented in a memory circuit. Duplicate instances of a module may be folded into a single shared circuit. For example, for a circuit design having first and second duplicate instances of a module and operating at a first clock frequency, the processor circuit modifies the representation of the circuit design in the memory circuit by removing the second instance and specifying circuitry that multiplexes input signals to the first instance, pipelines flip-flops within the first instance, provides a clock signal having a frequency that is double the first clock frequency, and provides aligned output signals from the shared circuit. Specifically, the processor circuit inserts a multiplexer that receives first and second input signals, which were the input signals to the first and second instances, alternates between selection of the first and second input signals at double the first clock frequency, and provides the selected input signal to the first instance. The processor circuit also inserts and connects a respective pipelined flip-flop to each flip-flop in the instance. The clock pins of the pipelined flip-flops are reconnected to the double-rate clock signal.

As the multiplexer circuit alternates between selection of the first and second input signals at double the first clock frequency, and the flip-flops in the instance are pipelined at double the first clock frequency, the output signal from the first instance alternates at double the first clock frequency between representing a state resulting from the first input signal and representing a state resulting from the second input signal. The alignment circuit inserted in the circuit design receives the output signal from the first instance and concurrently provides states of the first and second output signals, respectively.

Figure 2:
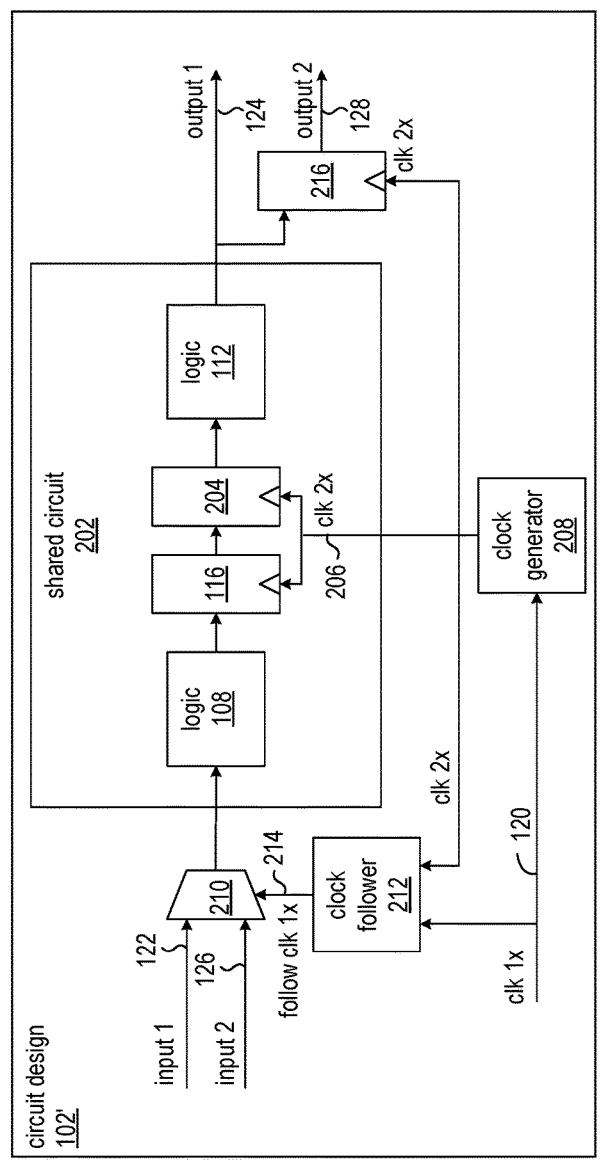
FIG. 2 shows a single shared circuit generated from the two instances in FIG. 1.

FIGS. 1 and 2 show the transformation of duplicate instances of a module in a circuit design into a single, shared circuit. FIG. 1 shows a circuit design 102 having duplicate instances 104 and 106 of a module A in the circuit design. The circuit design 102 may be a hierarchical representation, such as a register transfer language specification, and stored in a memory or storage arrangement of a computer system. A module specifies a particular logic function and/or memory along with an input port, internal signals, and an output port. An instance of a module is a particular copy of the module within the circuit design and has specified connections to instances of the same or different modules.

Logic circuit 108 in instance 104 is equivalent to logic circuit 110 in instance 106, and logic circuit 112 in instance 104 is equivalent to logic circuit 114 in instance 106. Flip-flop 116 is connected to logic circuits 108 and 112 in instance 104 in the same manner as flip-flop 118 is connected to logic circuits 110 and 114 in instance 106. Flip-flops 116 and 118 are clocked by clock signal 120 having a frequency x (denoted as "clk 1x"). The circuit design specifies that instance 104 receives input signal 122 (input 1) and generates output signal 124 (output 1), and that instance 106 receives input signal 126 (input 2) and generates output signal 128 (output 2).

Though only two instances of a particular module are shown, those skilled in the art will recognize that the circuit design 102 may include instances of other modules as well as additional instances of module A. Also, other modules may have different arrangements of logic circuits and more flip-flops than are shown for module A. The approaches described herein may be extended to other modules as will be recognized from the teachings that follow.

FIG. 2 shows a single shared circuit generated from the two instances in FIG. 1. Specifically, instances 104 and 106 of module A in FIG. 1 have been folded into a shared circuit 202. Circuit design 102' of FIG. 2 is a modified version of circuit design 102 of FIG. 1 and is functionally equivalent to circuit design 102.

In modifying circuit design 102, one of the duplicate instances is removed from the circuit design, and the remaining instance is modified to make the shared circuit 202. In the example of FIG. 2, instance 106 has been removed, and instance 104 of FIG. 1 has been modified and transformed into shared circuit 202. The logic circuits 108 and 112 from the instance 104 remain in the shared circuit 202, and a pipelined flip-flop 204 is added and connected serially between flip-flop 116 and logic circuit 112. Pipelined flip-flops 116 and 204 are clocked by a clock signal 206 that has a frequency (clk 2x) that is twice the frequency of clock signal 120 in instances 104 and 106. The circuit design 102 of FIG. 1 is further modified by adding a clock generator circuit 208 that generates the clock signal 206 from the clock signal 120.

Circuit design 102 of FIG. 1 is further modified to include a multiplexer 210 that is configured to select between input signals 122 and 126, which in circuit design 102 are the input signals to instances 104 and 106. A clock follower circuit 212 is inserted in the circuit design 102' to generate a clock follower signal 214 (follow clk 1x), which is a slightly delayed version of clock signal 120. The clock follower signal is used to control the multiplexer 210 instead of the clock signal 120 in order to avoid using a clock signal for a purpose other than as a clock signal, as it may be considered a bad design practice to send a clock signal into the data path of a design. When clock follower signal 214 is logic 0, the input signal 122 is selected for input to the shared circuit 202, and when clock follower signal 214 is logic 1, the input signal 126 is selected for input to the shared circuit. Selecting between input signals 122 and 126 using the clock follower signal 214 provides input to the shared circuit 202 at twice the rate at which input is provided to each of the instances 104 and 106 of FIG. 1.

An alignment circuit is inserted in the circuit design 102' in order to capture the output signal 128 in circuit design 102' at the middle of the clock period of the clock signal clk 1x. Otherwise this output signal might be erased during the second half cycle of the clock signal clk 1x when the output signal 124 is produced by the shared circuit 202. In one implementation, the alignment circuit includes alignment flip-flop 216 that is configured to receive the output signal 124 from the shared circuit 202 and that is clocked by clock signal 206. As an alternative to clock signal 206, which has twice the frequency of clock signal 120, the alignment flip-flop may be clocked by a phase-shifted version of clock signal 120.

Though the examples disclosed herein illustrate folding two instances into a shared circuit, the processes may be adapted to combine more than two instances of a module into a shared circuit. For example, for each flip-flop in the module, the number of pipelined flip-flops for that flip-flop in the shared circuit would be equal to the number of instances being combined. In folding N instances into a shared circuit, the frequency of the clock signal to the pipelined flip-flops would be a multiple, N, of the frequency of the clock signal to the flip-flops in the individual instances.

The folding of instances 104 and 106 into shared circuit 202 involved instances having flip-flops that are not clock-enabled. Flip-flops that are not clock-enabled load a new value at an edge of the clock signal. Clock-enabled flip-flops are generally used in a circuit design that calls for holding the last value stored in the flip-flop rather than loading a new value at the clock edge. The clock-enable input pin on the flip-flop may be enabled at the clock edge in order to load a new value into the flip-flop. In folding instances of a module into a shared circuit, the transformation of a clock-enabled flip-flop differs from the transformation of a non-clock-enabled flip-flop.

FIG. 3 shows the transformation of a clock-enabled flip-flop 302 found in two instances of a module when the instances are folded into a shared circuit. The clock-enabled flip-flop 302 receives the clock-enable signal 310, data signal 312, and clock signal 120 and outputs data signal 314. In folding two instances of a module into a shared circuit, the clock-enabled flip-flop 302 is replaced by pipelined flip-flops 304 and 306 that are not clock-enabled. The clock pins of the pipelined flip-flops are connected to the clock signal 206, which is twice the frequency of clock signal 120. Multiplexer 308 is inserted in the shared circuit and is controlled by the clock enable-signal 310. The multiplexer is connected to receive and select between data signal 312 and output signal 314 from the flip-flop 306. The signal selected by the multiplexer 308 is provided as the data input to flip-flop 304.

For some sequential circuits in module instances that are to be folded, it may be desirable to replace the sequential circuit with parallel sequential circuits. Such sequential circuits may include memory circuits such as LUT RAMs, BRAMs, or shift registers or a hierarchical circuit that contains sequential elements, such as the non-clock-enabled and clock-enabled flip-flops described above.

FIG. 4 shows the transformation of a sequential circuit into parallel sequential circuits when two instances of a module are folded into a shared circuit. Sequential circuit 402 is coupled to receive input signals, such as data and/or address signals, on signal line 404 and is clocked by clock signal 120, and output signals are output on signal line 406. The sequential circuit 402 may be replaced in the folding of two instances by parallel sequential circuits 408 and 410. Both of sequential circuits 408 and 410 are coupled to receive input signals 404. Sequential circuit 408 is clocked by clock signal 120, and sequential circuit 410 is clocked by inverted clock signal 120' (clk 1x').

Multiplexer 412 is inserted in the shared circuit and is coupled to receive output signals 414 from sequential circuit 408 and output signals 416 from sequential circuit 410. The multiplexer selects between output signals 414 and 416 in response to the follow clock signal 214 from the clock follower circuit 212.

In an alternative implementation involving folding two instances of a module having a shift register as the sequential circuit, the length of the shift register may be doubled and the initial state values re-aligned to follow an even-odd pattern.

FIG. 5 shows an example of a clock follower circuit 212. The clock follower circuit generates follow clock signal 214 (follow clk 1x), which is a delayed version of clock signal 120 (clk 1x). The clock follower circuit includes inverter 502, flip-flop 504, flip-flop 506, XNOR circuit 508 and flip-flop 510.

Flip-flop 504 is clocked by clock signal 120 and the data input is coupled to receive output from inverter 502. Inverter 502 is coupled to receive the output data signal 512 from flip-flop 504. Flip-flop 506 is also coupled to receive the output data signal from flip-flop 504 and is clocked by clock signal 206 (clk 2x). The XNOR circuit 508 is coupled to receive output data signal 512 from flip-flop 504 and the output data signal 514 from flip-flop 506. Flip-flop 510 has its data input pin coupled to receive the output signal 516 from XNOR circuit and is clocked by clock signal 206. Flip-flop 510 outputs the clock follower signal 214.

In a scenario in which more than two instances (N) are folded into a shared circuit, the clock generator circuit may be programmed to generate two clock signals of Nx and 2Nx, where x is the original clock rate. The clock follower circuit may then be configured to follow clock Nx. Multiple clock followers may be implemented in order to control multiple multiplexers in a multiplexer tree. The design may be simplified by limiting folding to N being a power of two.

Figure 6:
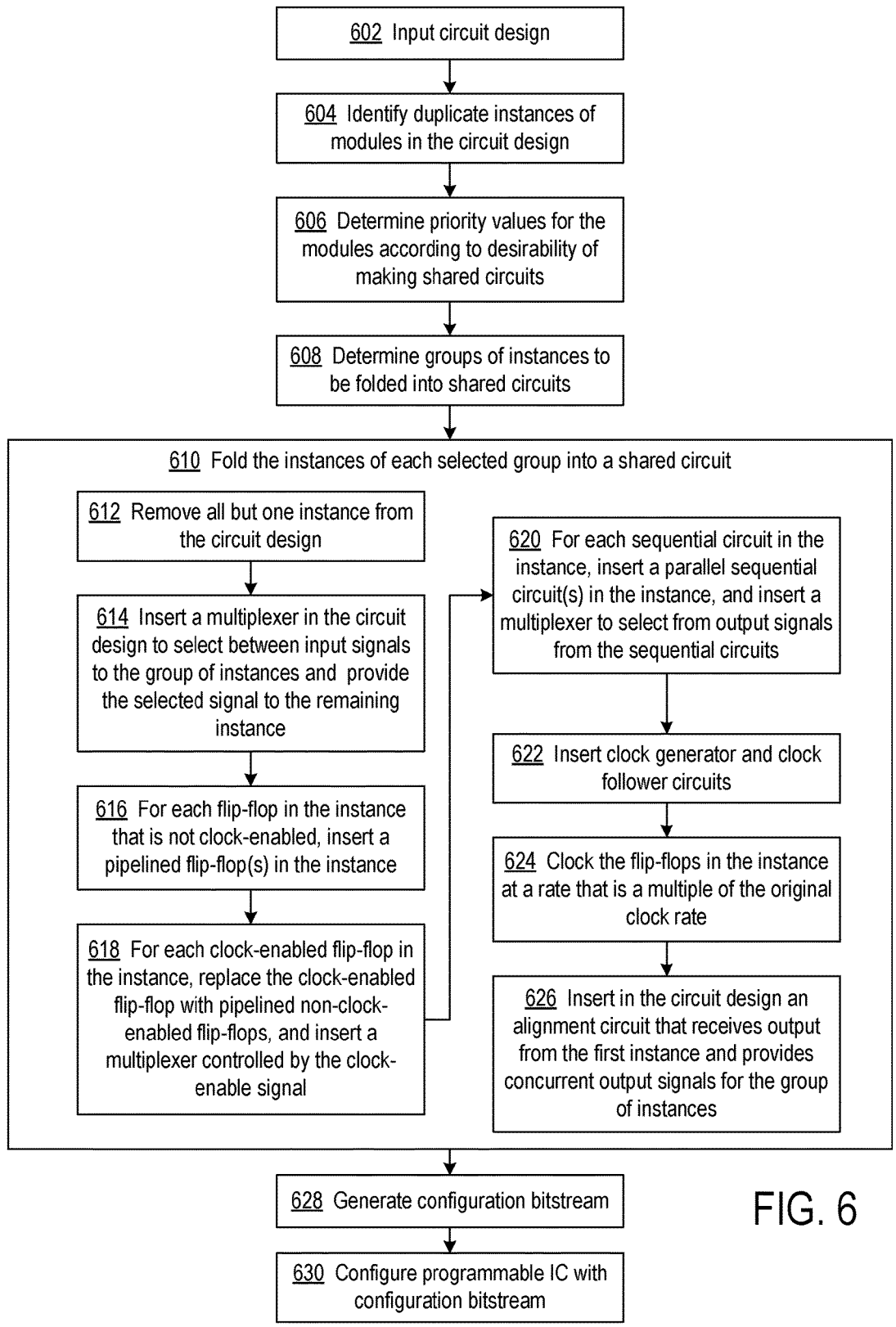
FIG. 6 shows a flowchart of a process for folding multiple instances of a module into a shared circuit.

FIG. 6 shows a flowchart of a process for folding multiple instances of a module into a shared circuit. A processor circuit, which is part of a computer system, for example, may perform the illustrated process on a representation of a circuit design that is stored in a memory of the computer system. The processor circuit inputs the circuit design at block 602 by reading data from the memory. At block 604, the processor circuit identifies duplicate instances of modules in the circuit design. In identifying duplicate instances, the processor circuit may traverse a hierarchical representation of the circuit design searching for instances having the same inputs, outputs, and circuit structure. Alternatively, a graph representation of a netlist may be searched for subgraph isomorphisms.

Modules having duplicate instances may be prioritized for folding. It may be useful to prioritize modules in order to avoid performing folding on multiple levels of nested logic because at each level the clock rate is multiplied by two or more, which becomes rapidly unsustainable. In this context, it may be more beneficial for area saving to fold the top level modules that contain more logic. For example, it may happen that module A contains two instances of module B and module B contains two instances of module C. Typically, folding both the duplicated instances of module B and module C may not be feasible because the resulting clock rate would be multiplied by 4. By sorting the modules by order of hierarchy, module A would be visited before module B and duplicate instances of module A would be folded. At block 606, priority values are determined for the modules identified as having duplicate instances in the circuit design. In one implementation, the priority value for a module may be determined based on the size of the module, where the size may be approximated by the number and types of circuit elements in an implementation of the module.

In another implementation, the priority value of a module may be determined based on the ratio of the number of input signals to the module to the number of LUTs in the module. For example, one module having a ratio of the number of inputs to the number of LUTs that is greater than the ratio of the number of inputs to the number of LUTs of another module, may have a priority value indicating a higher priority for folding instances of the module.

In another implementation, the priority value of a module may be determined based on the ratio of the number of LUTs to the number of flip-flops in the module. For example, one module having a ratio of the number of LUTs to flip-flops that is greater than the ratio of the number of LUTs to flip-flops of another module, may have a priority value indicating a higher priority for folding instances of the module.

At block 608, the processor circuit determines which groups of instances to fold into shared circuits. In one implementation, a subset of the modules having duplicate instances maybe selected for folding. For example, modules having a priority value greater than a threshold value may be selected for folding duplicate instances.

The processor circuit performs the operations set forth in block 610 in folding instances of each selected group into a shared circuit. At block 612, all but one instance of the duplicate instances in a group are removed from the circuit design, such as by deleting from the representation in the memory the circuit elements of the instances. At block 614, a multiplexer is inserted in the circuit design to select between input signals to the instances in the group and provide the selected signal to the remaining instance, which when complete, is the shared circuit. Multiplexer 210 of FIG. 2 is an example of a multiplexer inserted in the circuit design for folding two instances into a shared circuit.

The processor circuit processes non-clock-enabled flip-flops in the instance at block 616. For each non-clock-enabled flip-flop, the processor circuit inserts a pipelined flip-flop that is serially connected to the original flip-flop in the instance. In FIG. 2, for example, pipelined flip-flop 204 is inserted in the shared circuit 202 and serially connected to the original flip-flop 116. It will be recognized that in a scenario in which N instances are folded into a shared circuit, the shared circuit will have N pipeline-connected flip-flops. Clock pins of the pipelined flip-flops are connected to a clock signal having twice the frequency of the clock signal connected to the flip-flop in the original instance.

Clock-enabled flip-flops of the instance are processed by the processor circuit at block 618. For each clock-enabled flip-flop, the processor circuit replaces the clock-enabled flip-flop with serially connected non-clock-enabled flip-flops. It will be recognized that in a scenario in which N instances are folded into a shared circuit, the shared circuit will have N pipeline-connected flip-flops. In addition, a multiplexer is inserted to select between the input data signal to the original flip-flop and the output signal from the last flip-flop in the pipeline in response to the clock-enable signal as shown in FIG. 3. Clock pins of the pipelined flip-flops are connected to a clock signal having twice the frequency of the clock signal connected to the flip-flop in the original instance.

At block 620, the processor circuit inserts sequential circuits in parallel with the sequential circuits in the instance. As shown in FIG. 4, a multiplexer is also inserted to select between output signals from the sequential circuits. A control pin of the multiplexer is connected to a clock follower signal and the multiplexer selects between output signals from the parallel sequential circuits.

At block 622, a clock generator circuit and a clock follower circuit are inserted in the circuit design. The clock generator circuit inputs a clock signal and outputs another clock signal having a frequency that is a multiple of the frequency of the input clock signal. The multiple is the number of instances folded into a shared circuit. The clock follower circuit generates a delayed version of an input clock signal using the input and output clock signals of the clock generator circuit, as shown in FIG. 5. At block 624, the clock pins of the pipelined flip-flops in the shared circuit are connected to the output clock signal from the clock generator. The signal from the clock follower circuit is connected to the control pins of the inserted multiplexers.

At block 626, the processor circuit inserts an alignment circuit in the shared circuit. The alignment circuit receives the output signal from the shared circuit and concurrently provides states of the output signals from the folded instances, respectively.

At block 628, configuration data is generated from the modified circuit design having the shared circuit(s). For example, synthesis, place-and-route and bitstream generation tools may be executed to generate configuration data for an FPGA. At block 630, a programmable IC may be configured with the configuration data, thereby creating a circuit that operates according to the modified circuit design.

Figure 7:
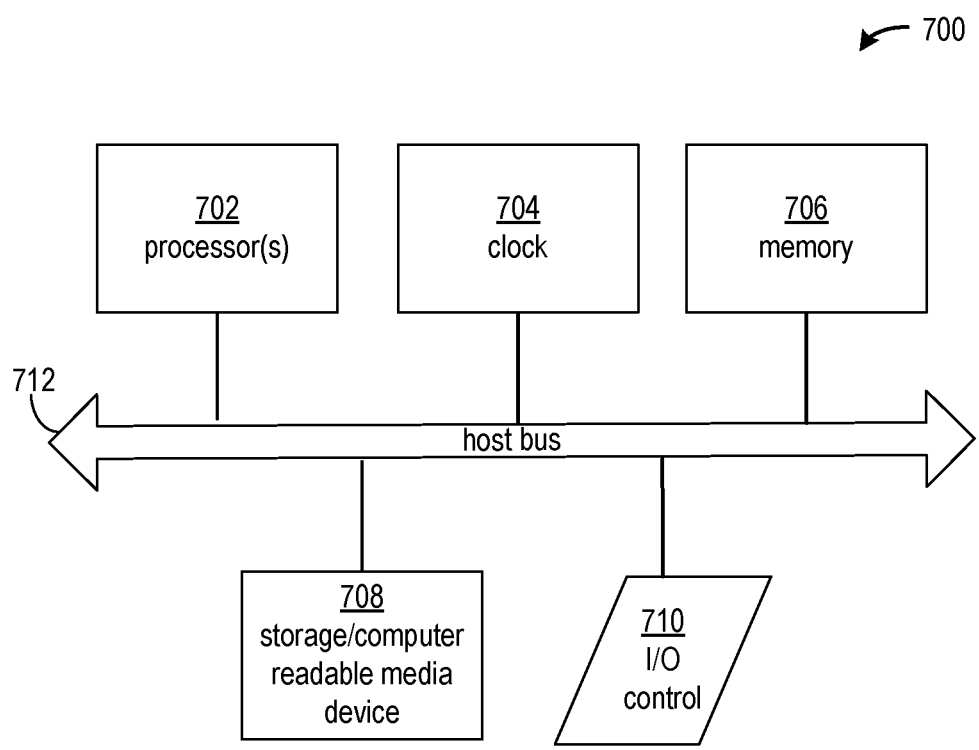
FIG. 7 shows a block diagram of an example computing arrangement that may be configured to implement the data structures and processes described herein.

FIG. 7 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 700 includes one or more processor circuits 702 (or "processors"), a clock signal generator 704, a memory arrangement 706, a storage arrangement 708, and an input/output control unit 710, all coupled to a host bus 712. The arrangement 700 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 702 may be one or more general purpose processors, or a combination of one or more general purpose processors and suitable co-processors, or one or more specialized processors (e.g., RISC, CISC, pipelined, etc.).

The memory arrangement 706 typically includes multiple levels of cache memory, and a main memory. The storage arrangement 708 may include local and/or remote persistent storage, such as provided by magnetic disks (not shown), flash, EPROM, or other non-volatile data storage. The storage unit may be read or read/write capable. Further, the memory arrangement 706 and storage arrangement 708 may be combined in a single arrangement.

The processor(s) 702 executes the software in storage arrangement 708 and/or memory arrangement 706, reads data from and stores data to the storage arrangement 708 and/or memory arrangement 706, and communicates with external devices through the input/output control arrangement 710. These functions are synchronized by the clock signal generator 704. The resource of the computing arrangement may be managed by either an operating system (not shown), or a hardware control unit (not shown).

Figure 8:
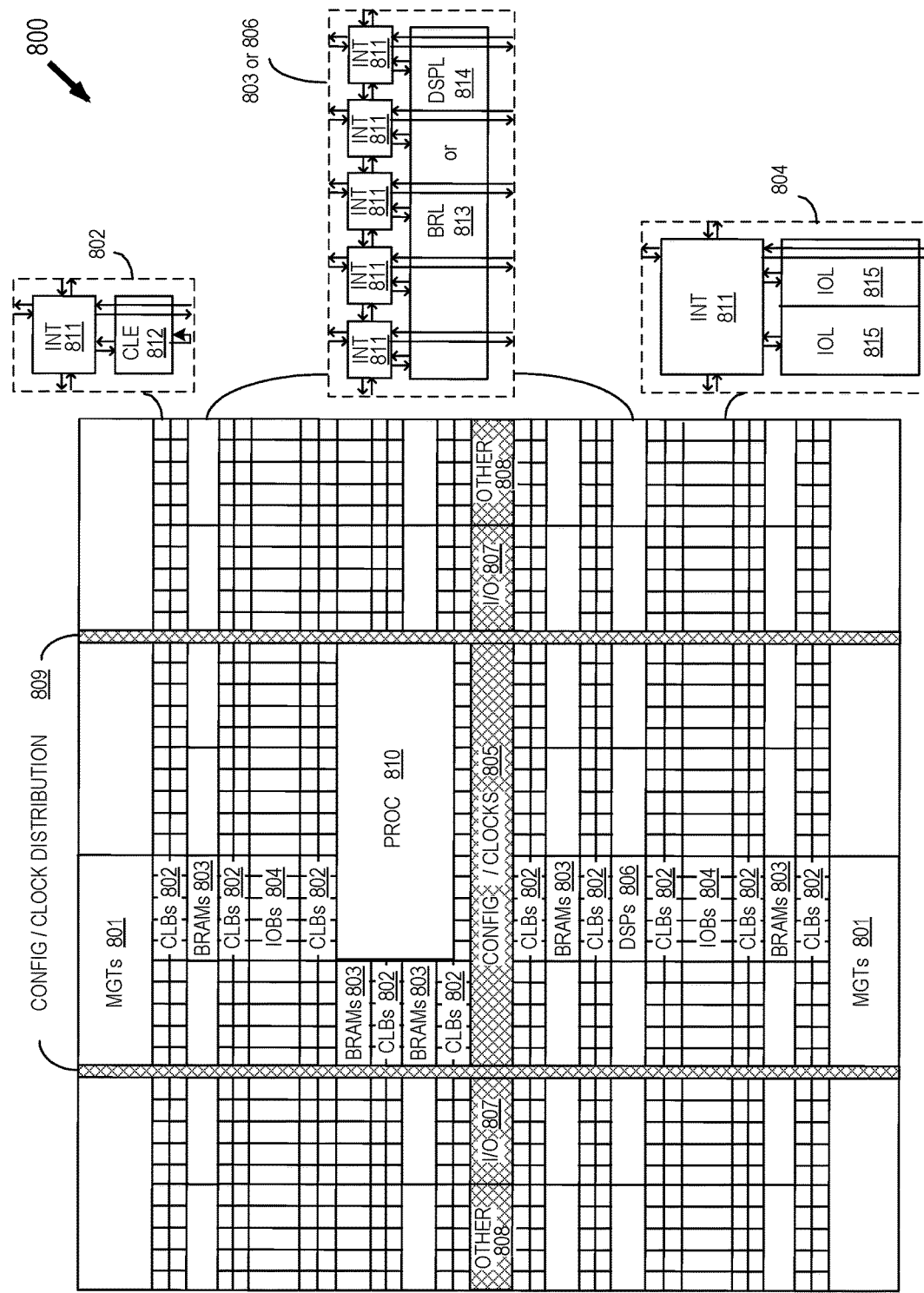
FIG. 8 shows a programmable integrated circuit (IC) on which the disclosed circuits may be implemented.

FIG. 8 shows a programmable integrated circuit (IC) 800 on which the disclosed circuits may be implemented. The programmable IC may also be referred to as a System On Chip (SOC) that includes field programmable gate array logic (FPGA) along with other programmable resources. FPGA logic may include several different types of programmable logic blocks in the array. For example, FIG. 8 illustrates programmable IC 800 that includes a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some programmable IC having FPGA logic also include dedicated processor blocks (PROC) 810 and internal and external reconfiguration ports (not shown).

In some FPGA logic, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA logic. The programmable interconnect element INT 811 also includes the connections to and from the programmable logic element within the same tile, as shown by the examples included at the top of FIG. 8.

For example, a CLB 802 can include a configurable logic element CLE 812 that can be programmed to implement user logic, plus a single programmable interconnect element INT 811. A BRAM 803 can include a BRAM logic element (BRL) 813 in addition to one or more programmable interconnect elements. Typically, the number of interconnect elements included in a tile depends on the height of the tile. In the pictured programmable IC, a BRAM tile has the same height as five CLBs, but other numbers (e.g., four) can also be used. A DSP tile 806 can include a DSP logic element (DSPL) 814 in addition to an appropriate number of programmable interconnect elements. An IOB 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, are manufactured using metal layered above the various illustrated logic blocks, and typically are not confined to the area of the input/output logic element 815.

In the pictured programmable IC, a columnar area near the center of the die (shown shaded in FIG. 8) is used for configuration, clock, and other control logic. Horizontal areas 809 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 8 include additional logic blocks that disrupt the regular columnar structure making up a large part of the programmable IC. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for improving circuit designs, both for circuit design that target programmable ICs and circuit designs that target application specific integrated circuits (ASICs). Other aspects and features will be apparent to those skilled in the art from consideration of the specification. It is intended that the specification and drawings be considered as examples only, with a true scope of the invention being indicated by the following claims.

What is claimed is:

1. A method of processing a circuit design, comprising:
   identifying duplicate instances of a module in a representation of the circuit design in a memory circuit;
   for at least one pair of the duplicate instances of the module that includes a first instance configured to receive a first input signal and generate a first output signal and a second instance configured to receive a second input signal and generate a second output signal, performing folding operations by a processor circuit, including:
      removing the second instance from the representation of the circuit design;
      inserting in the representation of the circuit design, a first multiplexer configured to receive the first and second input signals and to select one of the first and second input signals and provide the one of the first and second input signals to the first instance;
      inserting in the first instance for each flip-flop in the first instance, a respective pipelined flip-flop coupled to the flip-flop;
      replacing connections to a first clock signal in the first instance with connections to a second clock signal, wherein a frequency of the second clock signal is twice a frequency of the first clock signal; and
      inserting in the representation of the circuit design an alignment circuit configured to receive the first output signal from the first instance and provide the second output signal concurrent with the first output signal.

2. The method of claim 1, further comprising:
   determining a respective priority value by the processor circuit for each module having the duplicate instances;
   selecting a subset of a plurality of modules identified as having the duplicate instances as a function of each respective priority value; and performing the folding operations, for only each module in the subset, on each pair of duplicate instances of the module in the subset.

3. The method of claim 2, wherein the determining the respective priority value includes determining the respective priority value as a function of a number of circuit elements in each module.

4. The method of claim 2, wherein the determining the respective priority value includes determining the respective priority value as a function of a respective ratio of a number of input signals to each module to a number of look-up tables in each module.

5. The method of claim 2, wherein the determining the respective priority value includes determining the respective priority value as a function of a respective ratio of a number of look-up tables in each module to a number of flip-flops in each module.

6. The method of claim 1, wherein the inserting the alignment circuit includes inserting an alignment flip-flop configured to receive the first output signal and connecting a clock pin of the alignment flip-flop to the second clock signal.

7. The method of claim 1, wherein the inserting the alignment circuit includes inserting an alignment flip-flop configured to receive the first output signal and connecting a clock pin of the alignment flip-flop to a phase shifted version of the first clock signal.

8. The method of claim 1, wherein the inserting the respective pipelined flip-flop includes, for each clock-enabled flip-flop configured to input a data signal and a clock-enable signal:
  replacing the clock-enabled flip-flop with pipelined first and second flip-flops that are not clock-enabled, and connecting clock pins of the first and second flip-flops to the second clock signal; and
  inserting in the representation of the circuit design, a second multiplexer configured and arranged to receive and select one of the data signal and an output signal from the second flip-flop and provide the one of the data signal or the output signal from the second flip-flop as an input data signal to the first flip-flop, and connecting a control pin of the second multiplexer to the clock-enable signal.

9. The method of claim 1, wherein the folding operations further include:
  inserting in the first instance for a first sequential circuit in the first instance, a second sequential circuit;
  connecting each input signal of the first sequential circuit, to the second sequential circuit; and
  inserting in the representation of the circuit design, a second multiplexer configured and arranged to receive and select each output signal from the first sequential circuit or each output signal from the second sequential circuit and connecting a control pin of the second multiplexer to the second clock signal.

10. The method of claim 1, wherein the folding operations further include:
  inserting a clock generator circuit in the representation of the circuit design, and connecting the clock generator circuit to input the first clock signal, wherein the clock generator circuit is configured to generate the second clock signal.

11. The method of claim 1, wherein the folding operations further include:
  inserting a clock follower circuit in the representation of the circuit design, and connecting the clock follower circuit to input the first and second clock signals, wherein the clock follower circuit is configured to output a delayed version of the first clock signal;
  connecting the delayed version of the first clock signal to a control pin of the first multiplexer.

12. The method of claim 1, further comprising:
generating a configuration bitstream from the representation of the circuit design; and
configuring a programmable integrated circuit (IC) with the configuration bitstream.

13. A system for processing a circuit design, comprising:
a processor circuit;
a memory coupled to the processor circuit, wherein the memory is configured with instructions, that when executed by the processor circuit, cause the processor circuit to perform operations including:
  identifying duplicate instances of a module in a representation of the circuit design in the memory;
  for at least one pair of the duplicate instances of the module that includes a first instance configured to receive a first input signal and generate a first output signal and a second instance configured to receive a second input signal and generate a second output signal, performing folding operations including:
    removing the second instance from the representation of the circuit design;
    inserting in the representation of the circuit design, a first multiplexer configured to receive the first and second input signals and to select one of the first and second input signals and provide the one of the first or second input signals to the first instance;
    inserting in the first instance for each flip-flop in the first instance, a respective pipelined flip-flop coupled to the flip-flop;
    replacing connections to a first clock signal in the first instance with connections to a second clock signal, wherein a frequency of the second clock signal is twice a frequency of the first clock signal; and
    inserting in the representation of the circuit design an alignment circuit configured to receive the first output signal from the first instance and provide the second output signal concurrent with the first output signal.

14. The system of claim 13, wherein the memory is further configured with instructions that when executed by the processor circuit cause the processor circuit to perform further operations including:
  determining a respective priority value by the processor circuit for each module having the duplicate instances;
  selecting a subset of a plurality of modules identified as having the duplicate instances as a function of each respective priority value; and
  performing the folding operations, for only each module in the subset, on each pair of duplicate instances of the module in the subset.

15. The system of claim 14, wherein the determining the respective priority value includes determining the respective priority value as a function of a number of circuit elements in each module.

16. The system of claim 14, wherein the determining the respective priority value includes determining the respective priority value as a function of a respective ratio of a number of input signals to each module to a number of look-up tables in each module.

17. The system of claim 14, wherein the determining the respective priority value includes determining the respective priority value as a function of a respective ratio of a number of look-up tables in each module to a number of flip-flops in each module.

18. The system of claim 13, wherein the inserting the alignment circuit includes inserting an alignment flip-flop configured to receive the first output signal and connecting a clock pin of the alignment flip-flop to the second clock signal.

19. The system of claim 13, wherein the inserting the alignment circuit includes inserting an alignment flip-flop configured to receive the first output signal and connecting a clock pin of the alignment flip-flop to a phase shifted version of the first clock signal.

20. The system of claim 13, wherein the inserting the respective pipelined flip-flop includes, for each clock-enabled flip-flop configured to input a data signal and a clock-enable signal:
  replacing the clock-enabled flip-flop with pipelined first and second flip-flops that are not clock-enabled, and connecting clock pins of the first and second flip-flops to the second clock signal; and
  inserting in the representation of the circuit design, a second multiplexer configured and arranged to receive and select one of the data signal or an output signal from the second flip-flop and provide the one of the data signal or the output signal from the second flip-flop as an input data signal to the first flip-flop, and connecting a control pin of the second multiplexer to the clock-enable signal.

* * * * *